United States Patent
Canniff

(10) Patent No.: US 11,515,128 B2
(45) Date of Patent: Nov. 29, 2022

(54) CONFINEMENT RING WITH EXTENDED LIFE

(71) Applicant: LAM RESEARCH CORPORATION, Fremont, CA (US)

(72) Inventor: Justin Charles Canniff, San Jose, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 522 days.

(21) Appl. No.: 16/114,497

(22) Filed: Aug. 28, 2018

(65) Prior Publication Data

US 2020/0075295 A1     Mar. 5, 2020

(51) Int. Cl.
     *H01J 37/32*     (2006.01)

(52) U.S. Cl.
     CPC .. *H01J 37/32642* (2013.01); *H01J 37/32449* (2013.01); *H01J 37/32467* (2013.01); *H01J 2237/3321* (2013.01); *H01J 2237/3341* (2013.01)

(58) Field of Classification Search
     CPC .......... H01J 37/32642; H01J 37/32467; H01J 37/32449; H01J 2237/3341; H01J 2237/3321
See application file for complete search history.

(56) References Cited

U.S. PATENT DOCUMENTS

| | | | |
|---|---|---|---|
| 6,508,911 B1* | 1/2003 | Han | C23C 16/27 118/723 I |
| 2011/0010852 A1 | 1/2011 | Heimbrock et al. | |
| 2011/0108524 A1* | 5/2011 | Dhindsa | H01J 37/32623 216/59 |
| 2016/0031235 A1 | 2/2016 | Gerber et al. | |
| 2017/0011029 A1 | 1/2017 | Chatterjee et al. | |
| 2017/0025397 A1 | 1/2017 | Hung et al. | |
| 2017/0110293 A1* | 4/2017 | Sun | H01J 37/32495 |

FOREIGN PATENT DOCUMENTS

KR     101535155 B1     7/2015

OTHER PUBLICATIONS

Notification of Transmittal of International Search Report and Written Opinion corresponding to International Application No. PCT/US2019/047685 dated Dec. 6, 2019, 13 pages.

* cited by examiner

Primary Examiner — Ram N Kackar

(57) ABSTRACT

A confinement ring for a substrate processing system includes a lower wall, an outer wall, and an upper wall defining a plasma region within the confinement ring. A first plurality of slots is formed within the lower wall. The first plurality of slots provides fluid communication between the plasma region within the confinement ring and an environment external to the confinement ring. A recess is defined in a lower surface of the lower wall. A lower ring is arranged within the recess of the lower surface. The lower ring includes a second plurality of slots that provides fluid communication between the plasma region within the confinement ring and an environment external to the confinement ring via the first plurality of slots.

19 Claims, 5 Drawing Sheets

CONFINEMENT RING WITH EXTENDED LIFE

FIELD

The present disclosure relates to a plasma confinement ring for a semiconductor processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc. The substrate processing system may include a plasma confinement shroud or ring arranged around each of the substrate support and an upper electrode (e.g., a showerhead) to further confine the plasma within the volume above the substrate.

SUMMARY

A confinement ring for a substrate processing system includes a lower wall, an outer wall, and an upper wall defining a plasma region within the confinement ring. A first plurality of slots is formed within the lower wall. The first plurality of slots provides fluid communication between the plasma region within the confinement ring and an environment external to the confinement ring. A recess is defined in a lower surface of the lower wall. A lower ring is arranged within the recess of the lower surface. The lower ring includes a second plurality of slots that provides fluid communication between the plasma region within the confinement ring and an environment external to the confinement ring via the first plurality of slots.

In other features, the lower wall comprises a first material and the lower ring comprises a second material different from the first material. The second material has a greater resistance to plasma etching than the first material. The first material includes silicon and the second material includes anodized aluminum. The first material includes silicon and the second material includes yttrium oxide ($Y_2O_3$). The second material includes a diamond coating. The diamond coating is deposited onto the lower ring using chemical vapor deposition.

In other features, a thickness of the lower ring is between 10% and 50% of a thickness of the lower wall. The lower ring comprises a plurality of sections. A gap between the sections is axially aligned with one of the second plurality of slots. A gap between the sections is located between adjacent ones of the second plurality of slots. Spacing between adjacent ones of the second plurality of slots around the lower ring is uniform. The lower ring is configured to rotate within the recess. The lower ring is configured to be arranged in a first position within the recess such that each of the second plurality of slots is axially aligned with a respective one of the first plurality of slots and rotated to a second position within the recess such that each of the second plurality of slots is not axially aligned with the respective one of the first plurality of slots.

A method for adjusting a conductance of a confinement ring for a substrate processing system includes providing a lower ring within a lower wall of the confinement ring. The confinement ring includes a first plurality of slots, the lower ring includes a second plurality of slots, and the lower ring is in a first radial position relative to the confinement ring. The method further includes adjusting the lower ring from the first radial position to a second radial position relative to the confinement ring to adjust the conductance of the confinement ring.

In other features, in the first radial position, individual ones of the second plurality of slots are axially aligned with individual ones of the first plurality of slots. In the second radial position, the individual ones of the second plurality of slots are not axially aligned with the individual ones of the first plurality of slots. The lower ring is adjusted from the first radial position to the second radial position subsequent to a predetermined amount of plasma processing being performed within the substrate processing system. The predetermined amount of plasma processing includes at least one of a predetermined number of etching cycles and a predetermined period of etching.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A processing chamber of a substrate processing system may include a plasma confinement shroud or ring (referred to hereinafter as a confinement ring). The confinement ring may be arranged to confine plasma and other reactants within a desired region in the processing chamber. For example, the confinement ring may be positioned to surround a substrate support and an upper electrode to confine the plasma within a volume above a substrate and below the upper electrode.

In some examples, the confinement ring comprises a semiconductor material such as silicon, silicon carbide (SiC), etc. The confinement ring, which is grounded, is constructed to have a predetermined conductance to maintain consistent processing performance parameters. However, due to erosion of surfaces of the semiconductor material caused by exposure to plasma and other process materials, the conductance of the confinement ring (and, therefore, the conductance of the processing chamber) changes over time and may cause process drift. Accordingly, the confinement ring may require periodic replacement.

Systems and methods according to the principles of the present disclosure increase a lifetime of the confinement. For example, the confinement ring may implement one or more modifications configured to maintain the predetermined conductance of the confinement ring and reduce process variation as described below in more detail.

Figure 1:
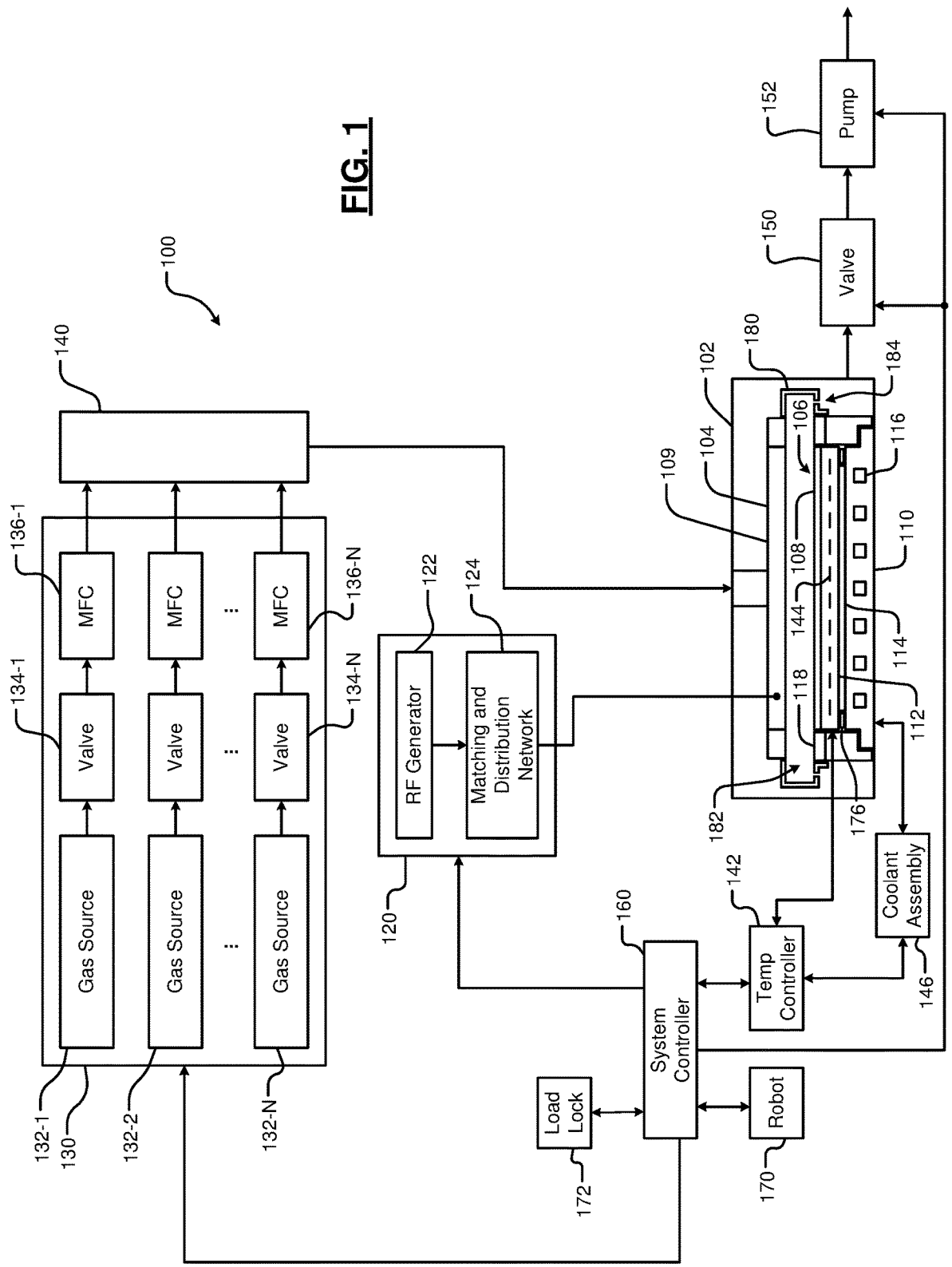
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The processing chamber 102 may include a confinement ring 180, such as a C-shroud as shown in FIG. 1. The confinement ring 180, which is typically grounded, is arranged around the upper electrode 104 and the substrate support 106 to confine plasma within a plasma region 182. In some examples, the confinement ring 180 comprises a semiconductor material, such as silicon, silicon carbide (SiC), etc. The confinement ring 180 may include one or more slots 184 arranged to allow gases to flow out of the plasma region 182 to be vented from the plasma chamber 106 via the valve 150 and the pump 152. In other words, the slots provide fluid communication between the plasma region 182 within the confinement ring 180 and an environment external to the confinement ring 180. The confinement ring 180 according to the principles of the present disclosure is configured to maintain a predetermined conductance as described below in more detail.

Figure 2A:
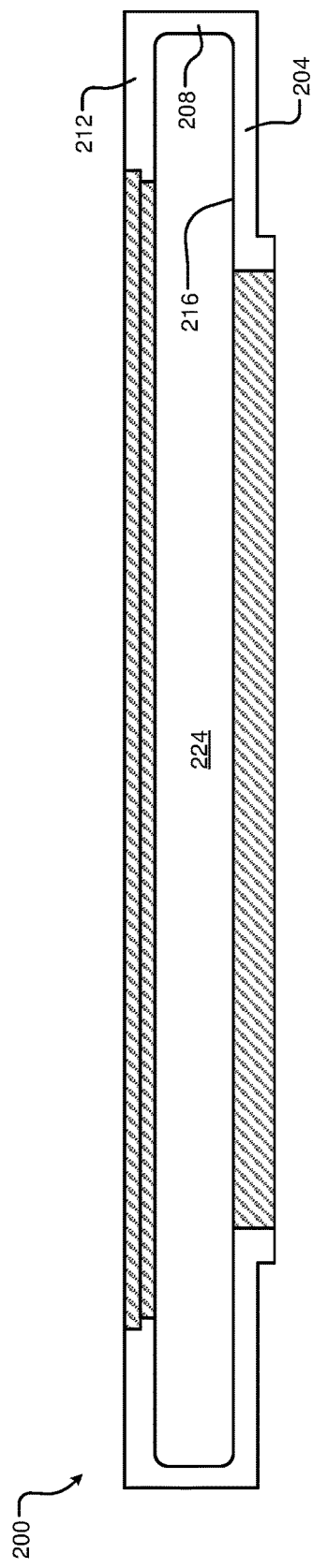
FIG. 2A is a side cross-sectional view of an example confinement ring according to the present disclosure.
Figure 2B:
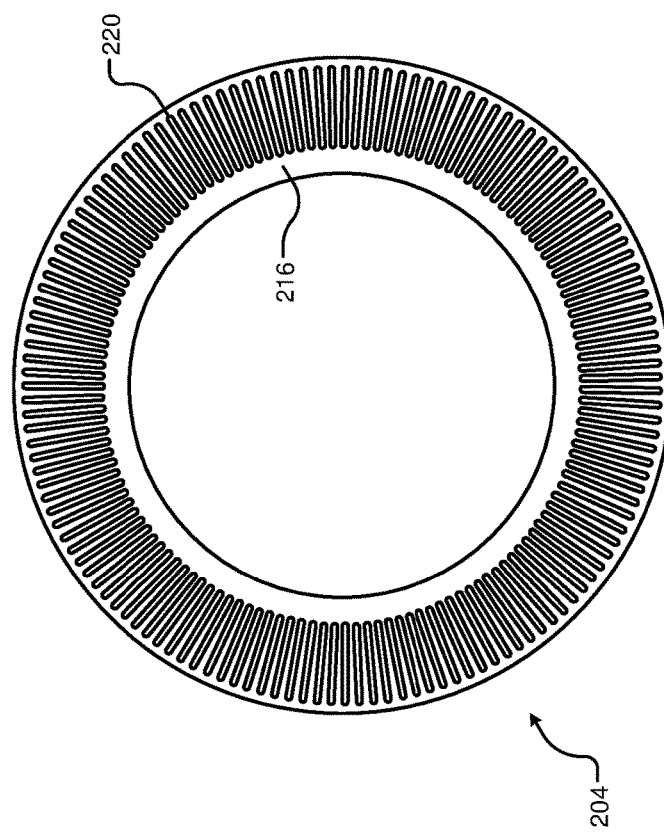
FIG. 2B is a top-down view of the example confinement ring of FIG. 2A.

Referring now to FIGS. 2A and 2B, an example confinement ring 200 is shown in more detail. The confinement ring 200 is shown in cross section in FIG. 2A. The confinement ring 200 includes an annular lower wall 204, outer wall 208, and upper wall 212. FIG. 2B shows a top-down view of an upper surface 216 of the lower wall 204.

The confinement ring 200 includes a plurality of slots 220 for allowing gases to be vented out of a plasma region 224 within the confinement ring 200. Dimensions of the slots (e.g., quantity, overall area, etc.) determine the conductance of the confinement ring 200 (and, therefore, of the conductance within the processing chamber). Over time, exposure to plasma causes the slots 220 to erode and widen, which changes the conductance within the processing chamber. For example only, inner portions of the slots 220 (i.e., portions of the slots 220 nearer to an inner diameter of the confinement ring 200) may erode at a greater rate than outer portions of the slots 220 (i.e., portions of the slots 200 nearer to an outer diameter of the confinement ring 200). Erosion of the slots 220 leads to eventual replacement of the confinement ring 200.

Figure 3C:
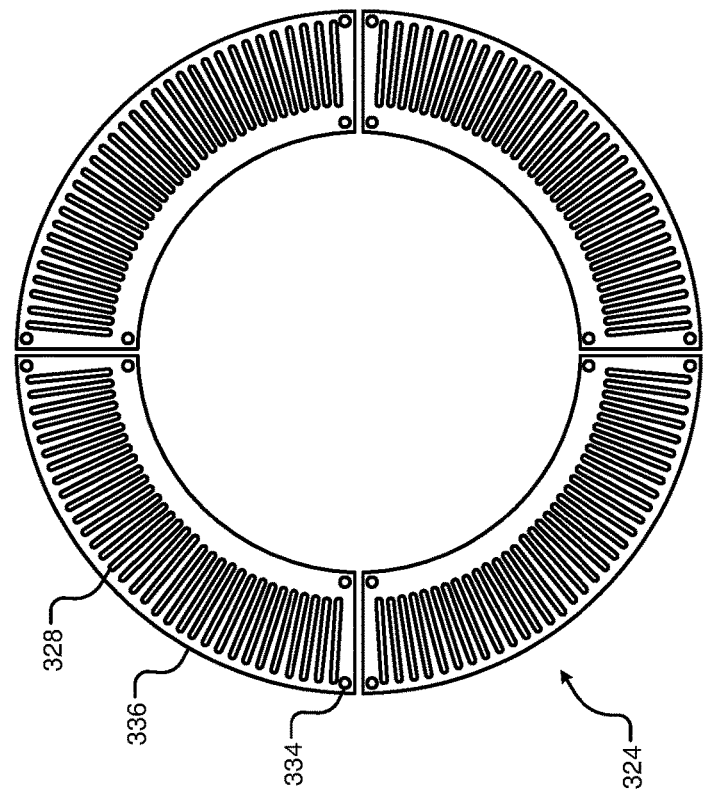
FIGS. 3A, 3B, 3C, 3D, and 3E show an example confinement ring including a lower ring according to the principles of the present disclosure.
Figure 3E:
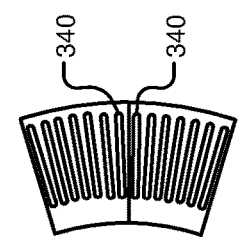
Figure 3D:
Figure 3A:
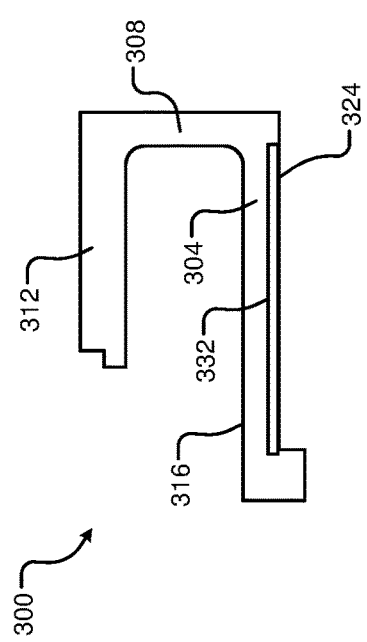
Figure 3B:
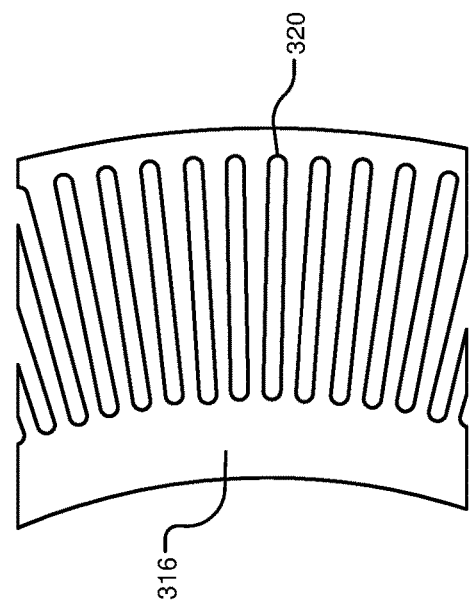

Referring now to FIGS. 3A, 3B, 3C, 3D, and 3E, an example confinement ring 300 according to the principles of the present disclosure is shown. The confinement ring 300 is shown in cross section in FIG. 3A. The confinement ring 300 includes an annular lower wall 304, outer wall 308, and upper wall 312. FIG. 3B shows a top-down view of a portion of an upper surface 316 of the lower wall 304. The lower wall 304 includes a plurality of slots 320.

The confinement ring 300 further includes a lower ring 324. The lower ring 324 includes a plurality of slots 328. The lower ring 324 is arranged within a recess 332 in a bottom surface of the lower wall 304. For example, the lower ring 324 is arranged within the recess 332 such that the slots 328 in the lower ring 324 are aligned (e.g., axially) with the slots 320 in the lower wall 304. For example only, the lower ring 324 is bolted to the lower wall 304 to retain the lower ring 324 within the recess 332 (e.g., through bolt holes 334). A thickness of the lower ring 324 may be 5-50% of an overall thickness of the lower wall 304.

The lower ring 324 comprises and/or is coated with a material that has a greater resistance to erosion (e.g., a greater resistance to plasma etching) than a material of the confinement ring 300. In one example, the lower ring 324 comprises anodized aluminum. In another example, the lower ring 324 comprises yttrium oxide ($Y_2O_3$). In another example, the lower ring 324 comprises silicon with a CVD diamond coating. The slots 328 of the lower ring 324 have a greater resistance to erosion (and, therefore, widening caused by erosion) than the slots 320 of the lower wall 304. As the slots 320 widen due to erosion, the width of the slots 328 is maintained, which in turn maintains the conductance of the confinement ring 300. Accordingly, a lifetime of the confinement ring 300 is increased significantly (e.g., by four times or more relative to a lifetime of a confinement ring without the lower wall 324).

As shown in FIG. 3C, the lower ring 324 is comprised of separate sections 336 (e.g., four 90° sections). In other examples, the lower ring 324 may include fewer or more of the sections 336, or may be a single piece. In some examples, gaps between the sections 336 may be aligned with one of the slots 340 as shown in FIG. 3D. In other examples, the gaps between the sections 336 may be located between adjacent ones of the slots 340 such that a uniform spacing between the slots 340 is maintained.

Figure 4B:
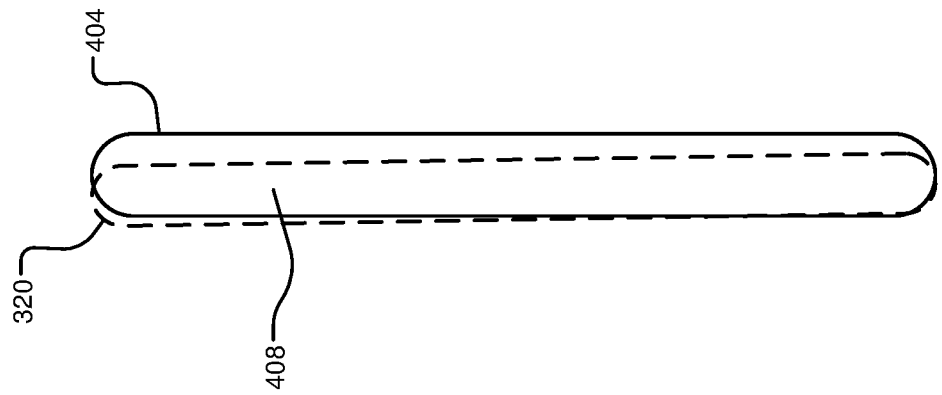
FIGS. 4A and 4B show another example confinement ring according to the present disclosure.
Figure 4A:
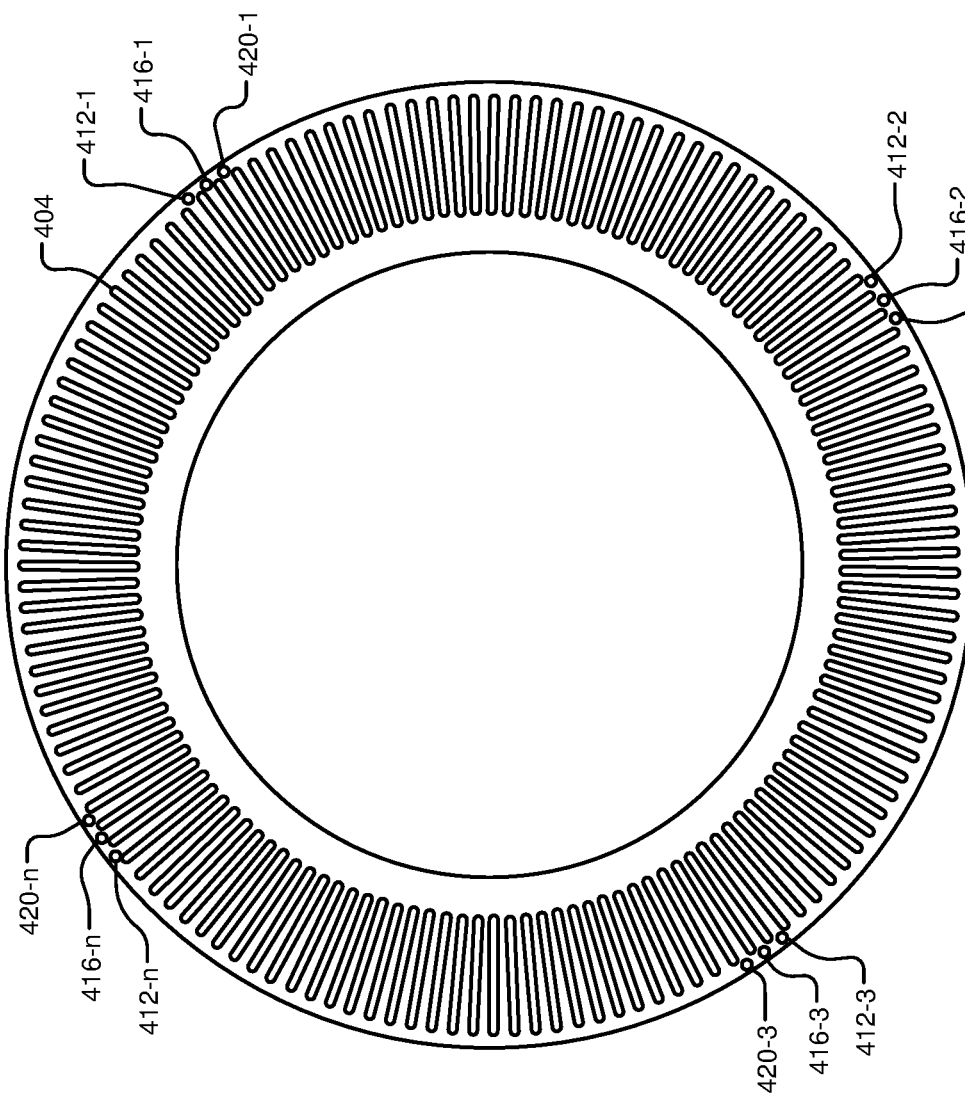

Another example lower ring 400 is shown in FIG. 4A. In this example, the lower ring 400 may be comprised of the same material as the confinement ring 300, may be a different material (e.g., anodized aluminum, $Y_2O_3$, etc.), and/or may include a coating (e.g., CVD diamond coating), and is also rotatable within the recess 332. For example, the lower ring 400 may be initially installed within the recess 332 such that slots 404 are aligned with the slots 320 of the lower wall 304. As the slots 320 erode over time, the lower ring 400 may be rotated to change an overall a size of an opening corresponding to the slots 320 and the slots 404. As shown in FIG. 4B, the slot 320 has widened due to erosion. Accordingly, the lower ring 400 may be rotated such that the slot 404 is not aligned with (i.e., axially aligned or centered) with the slot 320, reducing a size of an opening 408 formed through the slot 320 and the slot 404. Rotating the lower ring 400 to adjust respective sizes of the openings 408 controls the overall conductance of the confinement ring 300 and therefore increases the lifetime of the confinement ring 300.

As shown in FIG. 4A, the lower ring 400 may include multiple sets of screw or bolt holes 412-1, 412-2, 412-3, . . . , and 412-$n$ (referred to collectively as holes 412), 416-1, 416-2, 416-3, . . . , and 416-$n$ (referred to collectively as holes 416), 420-1, 420-2, 420-3, . . . , and 420-$n$ (referred to collectively as holes 420), etc. Accordingly, the lower ring 400 may be manually rotated through a plurality of fixed positions by aligning a selected one of the sets of holes with corresponding holes in the lower wall 304.

Figure 5:
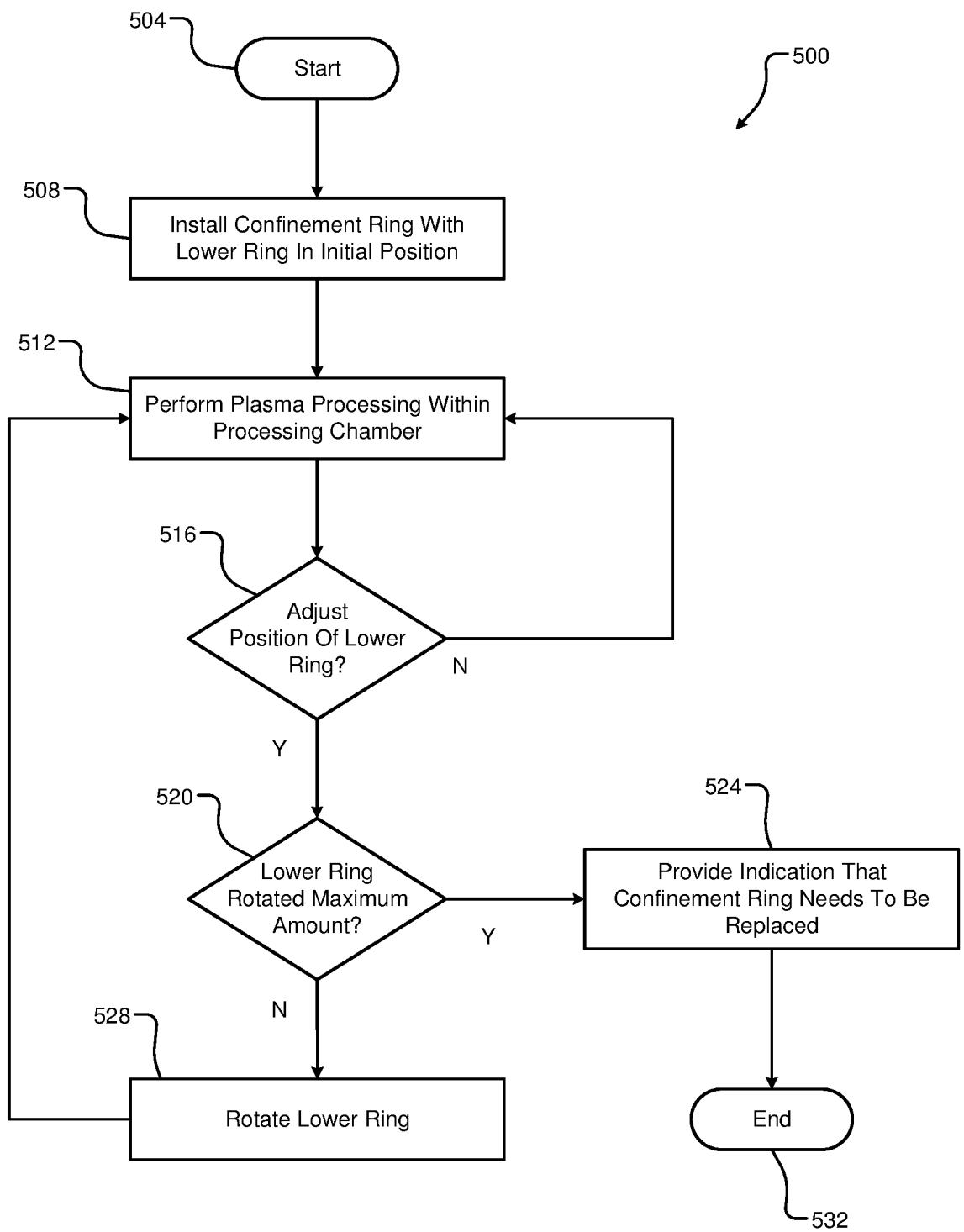
FIG. 5 illustrates steps of an example method for adjusting a conductance of a confinement ring according to the present disclosure.

Referring now to FIG. 5, an example method 500 for adjusting a conductance of a confinement ring according to the present disclosure begins at 504. At 508, a confinement ring 300 including a lower ring 400 in an initial position (e.g., a first radial position) is installed within a processing chamber. For example only, in the initial position, the slots 404 of the lower ring 400 are aligned (e.g., axially) with the slots 320 of the lower wall 304. At 512, the plasma processing (e.g., etching) is performed within the processing chamber. At 516, the method 500 determines whether to adjust a radial position of the lower ring 400. For example, the method 500 may determine that the lower ring 400 should be rotated in response to a predetermined number of etching cycles being performed, a predetermined period of etching, etc. If true, the method 500 continues to 520. If false, the method 500 continues to 512.

At 520, the method 500 determines whether the lower ring 400 has been rotated a maximum number of times. For example, the lower ring 400 may only be rotated the maximum number of times (e.g., 3, 4, 5) before the confinement ring 300 needs to be replaced. If true, the method 500 continues to 524. If false, the method 500 continues to 528. At 524, the method 500 provides an indication (e.g., via the system controller 160) that the confinement ring 300 needs to be replaced and ends at 532.

At 528, the lower ring 400 is rotated to adjust a radial position of the slots 404 relative to the slots 320 and the method 500 then continues to 512. In this manner, the lower ring 400 may be rotated one or more times into different positions to maintain a desired conductance of the confinement ring 300.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A confinement ring for a substrate processing system, the confinement ring comprising:
   a lower wall, an outer wall, and an upper wall defining a plasma region within the confinement ring;
   a first plurality of slots formed within the lower wall, wherein the first plurality of slots provides fluid communication between the plasma region within the confinement ring and an environment external to the confinement ring;
   a recess defined in a lower surface of the lower wall; and
   a lower ring arranged within the recess of the lower surface, wherein the lower ring includes a second plurality of slots that provides fluid communication between the plasma region within the confinement ring and the environment external to the confinement ring via the first plurality of slots.

2. The confinement ring of claim 1, wherein the lower wall comprises a first material and the lower ring comprises a second material different from the first material.

3. The confinement ring of claim 2, wherein the second material has a greater resistance to plasma etching than the first material.

4. The confinement ring of claim 2, wherein the first material includes silicon and the second material includes anodized aluminum.

5. The confinement ring of claim 2, wherein the first material includes silicon and the second material includes yttrium oxide (Y2O3).

6. The confinement ring of claim 2, wherein the second material includes a diamond coating.

7. The confinement ring of claim 6, wherein the diamond coating is deposited onto the lower ring using chemical vapor deposition.

8. The confinement ring of claim 1, wherein a thickness of the lower ring is between 10% and 50% of a thickness of the lower wall.

9. The confinement ring of claim 1, wherein the lower ring comprises a plurality of sections.

10. The confinement ring of claim 9, wherein a gap between the sections is axially aligned with one of the second plurality of slots.

11. The confinement ring of claim 9, wherein a gap between the sections is located between adjacent ones of the second plurality of slots.

12. The confinement ring of claim 1, wherein spacing between adjacent ones of the second plurality of slots around the lower ring is uniform.

13. The confinement ring of claim 1, wherein the lower ring is configured to rotate within the recess.

14. The confinement ring of claim 11, wherein the lower ring is configured to be (i) arranged in a first position within the recess such that each of the second plurality of slots is axially aligned with a respective one of the first plurality of slots and (ii) rotated to a second position within the recess such that each of the second plurality of slots is not axially aligned with the respective one of the first plurality of slots.

15. A method for adjusting a conductance of a confinement ring for a substrate processing system, the method comprising:
   providing a lower ring within a recess defined in a lower surface of a lower wall of the confinement ring, wherein the confinement ring includes a first plurality of slots and the lower ring includes a second plurality of slots, and wherein the lower ring is in a first radial position relative to the confinement ring;
   adjusting the lower ring from the first radial position to a second radial position relative to the confinement ring to adjust the conductance of the confinement ring.

16. The method of claim 15, wherein in the first radial position, individual ones of the second plurality of slots are axially aligned with individual ones of the first plurality of slots.

17. The method of claim 16, wherein in the second radial position, the individual ones of the second plurality of slots are not axially aligned with the individual ones of the first plurality of slots.

18. The method of claim 15, wherein the lower ring is adjusted from the first radial position to the second radial position subsequent to a predetermined amount of plasma processing being performed within the substrate processing system.

19. The method of claim 18, wherein the predetermined amount of plasma processing includes at least one of a predetermined number of etching cycles and a predetermined period of etching.

* * * * *